(12) United States Patent
Kwon et al.

(10) Patent No.: US 12,520,671 B2
(45) Date of Patent: Jan. 6, 2026

(54) DISPLAY DEVICE AND METHOD OF MANUFACTURING THE SAME

(71) Applicant: Samsung Display Co., LTD., Yongin-si (KR)

(72) Inventors: Sungjoo Kwon, Goyang-si (KR); Joonyong Park, Gunpo-si (KR); Subin Bae, Hwaseong-si (KR); Hyunah Sung, Suwon-si (KR); Hyuneok Shin, Gwacheon-si (KR); Dongmin Lee, Anyang-si (KR); Juhyun Lee, Seongnam-si (KR); Yu-Gwang Jeong, Anyang-si (KR); Sungwon Cho, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 479 days.

(21) Appl. No.: 18/076,480

(22) Filed: Dec. 7, 2022

(65) Prior Publication Data
US 2023/0309348 A1    Sep. 28, 2023

(30) Foreign Application Priority Data
Mar. 25, 2022   (KR) ......................... 10-2022-0037583

(51) Int. Cl.
| | |
|---|---|
| H10K 59/122 | (2023.01) |
| H10K 50/844 | (2023.01) |
| H10K 59/123 | (2023.01) |
| H10K 59/88 | (2023.01) |
| H10K 71/00 | (2023.01) |
| H10K 59/12 | (2023.01) |

(52) U.S. Cl.
CPC ......... *H10K 59/123* (2023.02); *H10K 50/844* (2023.02); *H10K 59/122* (2023.02); *H10K 59/88* (2023.02); *H10K 71/00* (2023.02); *H10K 59/1201* (2023.02)

(58) Field of Classification Search
CPC ........................... H10K 59/122; H10K 59/123
See application file for complete search history.

(56) References Cited

U.S. PATENT DOCUMENTS

| | | | |
|---|---|---|---|
| 6,825,496 B2 | 11/2004 | Yamazaki et al. | |
| 2015/0253637 A1* | 9/2015 | Shen ................. | H10D 86/0231 |
| | | | 438/158 |
| 2021/0057504 A1 | 2/2021 | Ko et al. | |

FOREIGN PATENT DOCUMENTS

| | | |
|---|---|---|
| KR | 10-2015-0134953 | 12/2015 |
| KR | 10-2017-0124070 | 11/2017 |
| KR | 10-2018-0013227 | 2/2018 |
| KR | 10-2019-0079245 | 7/2019 |

(Continued)

*Primary Examiner* — Douglas M Menz
(74) *Attorney, Agent, or Firm* — Innovation Counsel LLP

(57) ABSTRACT

A display device includes a transistor disposed on a substrate, an organic layer disposed on the transistor and defining grooves, a first pixel electrode disposed on the organic layer, electrically connected to the transistor, and including a pixel metal layer and a pixel protective layer, the pixel protective layer including at least one of an oxide and a halide and surrounding the pixel metal layer, and a dummy electrode disposed on the organic layer, spaced apart from the transistor, and including a dummy metal layer and a dummy protective layer, the dummy protective layer including at least one of an oxide and a halide and surrounding the dummy metal layer.

10 Claims, 14 Drawing Sheets

(56) References Cited

FOREIGN PATENT DOCUMENTS

KR 10-2020-0036291 A 4/2020
KR 10-2021-0022206 A 3/2021

* cited by examiner

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0037583 under 35 U.S.C. § 119, filed on Mar. 25, 2022 in the Korean Intellectual Property Office (KIPO), the entire contents of which are incorporated by reference herein.

BACKGROUND

1. Technical Field

Embodiments relate to a display device. More particularly, embodiments relate to the display device and a method of manufacturing the same.

2. Description of the Related Art

The display device is a device that displays an image for providing visual information to a user. Among display devices, an organic light emitting diode display has recently attracted attention.

The organic light-emitting display device has a self-emission characteristic and does not require a separate light source, unlike a liquid crystal display device, so that the thickness and weight may be reduced. In addition, the organic light emitting diode display device exhibits high quality characteristics such as low power consumption, high luminance, and high reaction speed.

SUMMARY

Embodiments provide a display device with improved stability during a manufacturing process.

Other embodiments provide a method of manufacturing the display device.

A display device according to an embodiment may include a transistor disposed on a substrate, an organic layer disposed on the transistor and defining grooves, a first pixel electrode disposed on the organic layer, electrically connected to the transistor, and including a pixel metal layer and a pixel protective layer, the pixel protective layer including at least one of an oxide and a halide and surrounding the pixel metal layer, and a dummy electrode disposed on the organic layer, spaced apart from the transistor, and including a dummy metal layer and a dummy protective layer, the dummy protective layer including at least one of an oxide and a halide and surrounding the dummy metal layer.

In an embodiment, the dummy electrode and the first pixel electrode may be disposed on a same layer, be spaced apart from each other, and include a same material.

In an embodiment, the first pixel electrode may further include a first sub-pixel electrode disposed under the pixel metal layer and a second sub-pixel electrode disposed on the pixel metal layer, and the dummy electrode may further include a first sub-dummy electrode disposed under the dummy metal layer and a second sub-dummy electrode disposed on the dummy metal layer.

In an embodiment, the first sub-pixel electrode and the first sub-dummy electrode may be disposed on a same layer and include a same material, the pixel metal layer and the dummy metal layer may be disposed on a same layer and include a same material, and the second sub-pixel electrode and the second sub-dummy electrode may be disposed on a same layer and include a same material.

In an embodiment, each of the grooves may have an undercut shape.

In an embodiment, the grooves may surround each of the first pixel electrode and the dummy electrode in a plan view.

In an embodiment, the display device may further include a pixel defining layer disposed on the organic layer and defining a pixel opening overlapping the first pixel electrode in a plan view, a light emitting layer disposed on the pixel defining layer, the first pixel electrode, and the dummy electrode and disposed in the pixel opening and a common electrode layer disposed on the light emitting layer.

In an embodiment, the dummy electrode may be spaced apart from the pixel defining layer.

In an embodiment, the light emitting layer may include a first portion overlapping the first pixel electrode in a plan view, and a second portion overlapping the dummy electrode in a plan view, and the first portion and the second portion may be spaced apart from each other.

In an embodiment, each of a length from a side surface of the pixel metal layer to a side surface of the pixel protective layer and a length from a side surface of the dummy metal layer to a side surface of the dummy protective layer may be about 5 Å to about 1000 Å.

A method of manufacturing a display device according to an embodiment may include forming a transistor on a substrate, forming an organic layer on the transistor, forming a pixel electrode layer including a metal layer on the organic layer, forming a pixel electrode including a pixel metal layer and a dummy electrode including a dummy metal layer by patterning the pixel electrode layer, forming a pixel protective layer by oxidizing or halogenating a portion of the pixel metal layer, forming a dummy protective layer by oxidizing or halogenating a portion of the dummy metal layer and forming a groove between the pixel electrode and the dummy electrode in the organic layer.

In an embodiment, each of the pixel protective layer and the dummy protective layer may include at least one of an oxide and a halide.

In an embodiment, the forming of the pixel electrode layer may include forming a first sub-pixel electrode layer on the organic layer, forming the metal layer on the first sub-pixel electrode layer and forming a second sub-pixel electrode layer on the metal layer, and the forming of the pixel electrode and the dummy electrode may include forming the pixel electrode including a first sub-pixel electrode, the pixel metal layer, and a second sub-pixel electrode by patterning the first sub-pixel electrode layer, the metal layer, and the second sub-pixel electrode layer, and forming the dummy electrode including a first sub-dummy electrode, the dummy metal layer, and a second sub-dummy electrode by patterning the first sub-pixel electrode layer, the metal layer, and the second sub-pixel electrode layer.

In an embodiment, the forming of the pixel protective layer and the forming of the dummy protective layer may be simultaneously performed.

In an embodiment, the forming of the pixel protective layer may include converting a portion of the pixel metal layer into the pixel protective layer including an oxide by natural oxidation, and the forming of the dummy protective layer may include converting a portion of the dummy metal layer into the dummy protective layer including an oxide by natural oxidation.

In an embodiment, before the forming of the groove in the organic layer, each of the forming of the pixel protective layer and the forming of the dummy protective layer may include performing a plasma treatment on the pixel electrode and the dummy electrode.

In an embodiment, the forming of the pixel protective layer may include converting a portion of the pixel metal layer into the pixel protective layer including an oxide by oxidizing the pixel metal layer by the plasma treatment, and the forming of the dummy protective layer may include converting a portion of the dummy metal layer into the dummy protective layer including an oxide by oxidizing the dummy metal layer by the plasma treatment.

In an embodiment, the forming of the pixel protective layer may include converting a portion of the pixel metal layer into the pixel protective layer including a halide by halogenating the pixel metal layer by the plasma treatment, and the forming of the dummy protective layer may include converting a portion of the dummy metal layer into the dummy protective layer including a halide by halogenating the dummy metal layer by the plasma treatment.

In an embodiment, the method may further include forming a pixel defining layer defining a pixel opening overlapping the pixel electrode in a plan view and a dummy opening overlapping the dummy electrode on the organic layer in a plan view, forming a light emitting layer overlapping the pixel opening on the pixel defining layer, the pixel electrode, and the dummy electrode in a plan view, and forming a common electrode layer on the light emitting layer.

In an embodiment, the dummy opening may be spaced apart from the dummy electrode and a portion of the organic layer overlapping the dummy electrode in a plan view.

In the display device according to embodiments, as each of the electrodes included in the display device includes the protective layer surrounding the metal layer, the protective layer may protect the metal layer. Accordingly, in the process of manufacturing the display device, as the metal layer included in each of the electrodes is protected, the formation of byproducts due to the metal layer may be prevented. As a result, the stability of the display device may be improved, and leakage current between the pixel electrodes may be prevented, thereby the problem of color mixing of the display device may be solved.

DETAILED DESCRIPTION OF THE EMBODIMENTS

Figure 1:
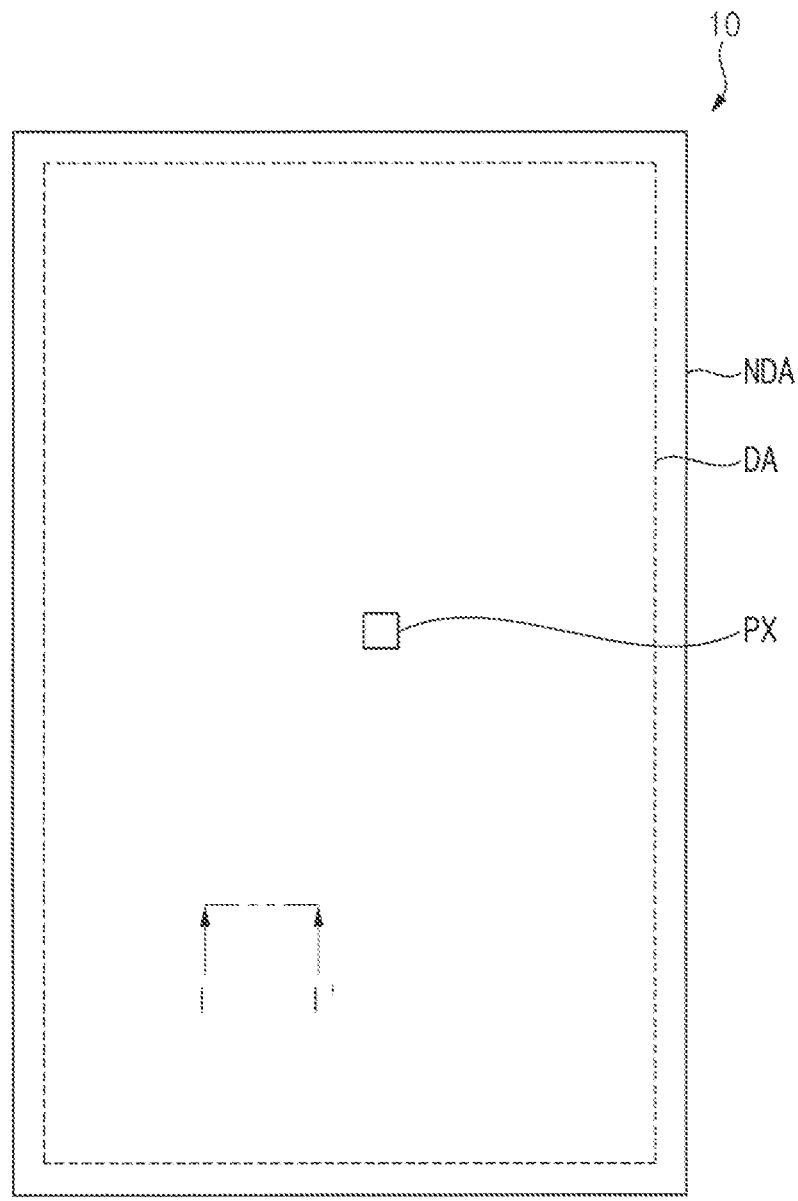
FIG. 1 is a schematic plan view illustrating a display device according to an embodiment.

Hereinafter, display devices in accordance with embodiments will be described in more detail with reference to the accompanying drawings. The same reference numerals are used for the same components in the drawings, and redundant descriptions of the same components will be omitted.

Spatially relative terms, such as "beneath," "below," "under," "lower," "on," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view illustrating a display device according to an embodiment.

Referring to FIG. 1, a display device 10 may include a display area DA and a non-display area NDA. The display area DA may display an image. Pixels PX which emit light and lines which transmit a driving signal to the pixels PX may be disposed in the display area DA. Examples of the lines may include a gate line and a data line. The gate lines may transmit a gate signal, and the data lines may transmit a data signal.

The non-display area NDA may be an area which does not display an image. Lines for driving and drivers may be disposed in the non-display area NDA. For example, a gate driver, a light emitting driver, a pad, and a driving chip may be disposed in the non-display area NDA. The non-display area NDA may be adjacent to the display area DA and may surround at least one surface of the display area DA. However, embodiments according to the disclosure are not limited thereto, and the image may be displayed in the non-display area NDA.

Figure 2:
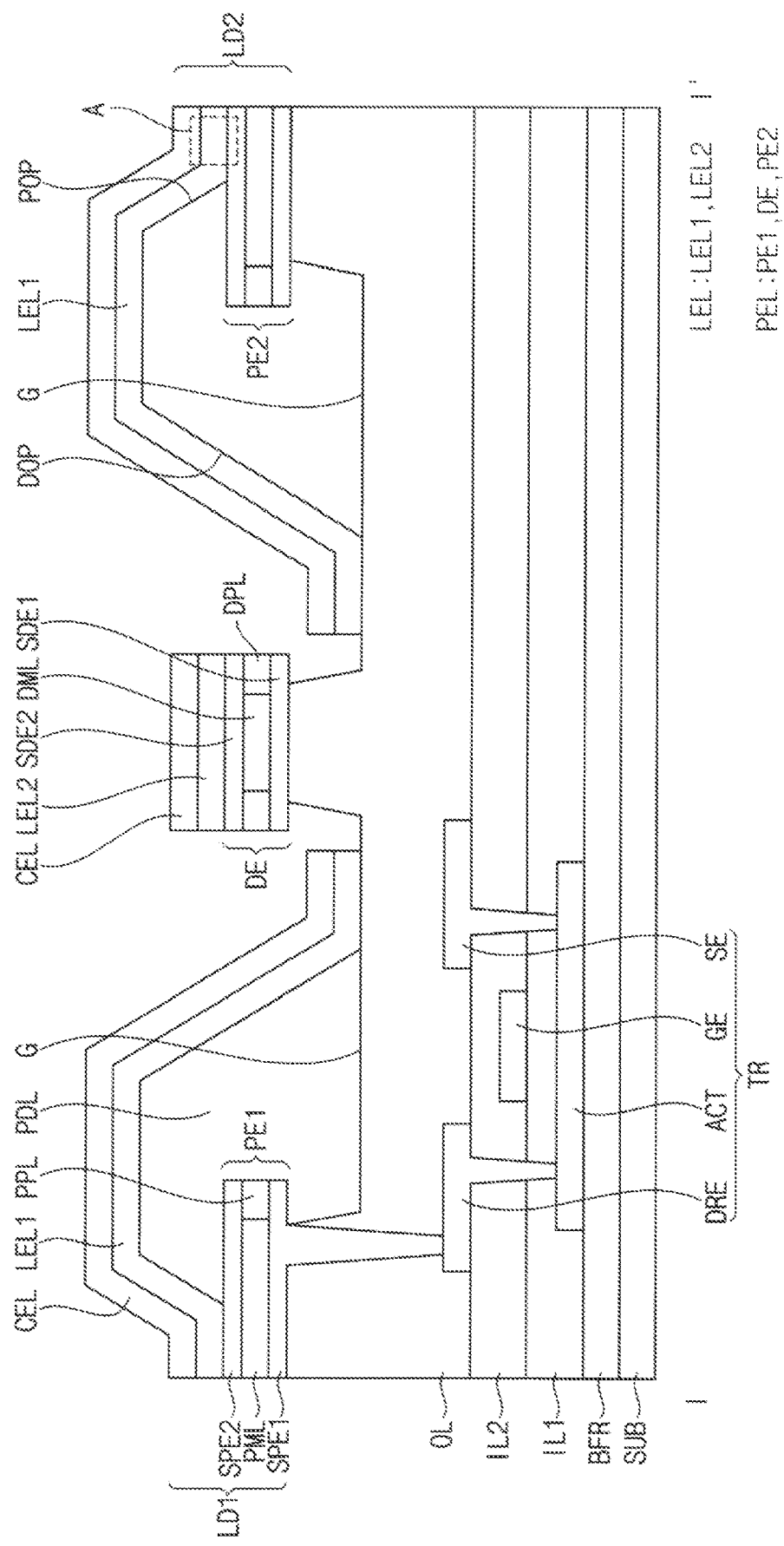
FIG. 2 is a schematic cross-sectional view taken along line I-I' of FIG. 1.

FIG. 2 is a schematic cross-sectional view taken along line I-I' of FIG. 1.

Referring to FIGS. 1 and 2, the display device 10 may include a substrate SUB, a buffer layer BFR, at least one transistor TR, a first insulation layer IL1 a second insulation layer IL2, an organic layer OL, a pixel electrode layer PEL, a pixel defining layer PDL, a spacer, a light emitting layer LEL, a common electrode layer CEL, and an encapsulation layer. The transistor TR may include an active layer ACT, a gate electrode GE, a source electrode SE, and a drain electrode DRE.

The substrate SUB may be formed of (or include), e.g., glass, quartz, plastic, or the like. The buffer layer BFR may be disposed on the substrate SUB. The buffer layer BFR may prevent diffusion of metal atoms or impurities from the substrate SUB to the active layer ACT.

The active layer ACT may be disposed on the substrate SUB. The active layer ACT may be divided into a source region and a drain region doped with impurities, and a channel region between the source region and the drain region.

The first insulation layer IL1 may be disposed on the buffer layer BFR. The first insulation layer IL1 may cover (or overlap in a plan view) the active layer ACT and may be formed to have substantially a same thickness along a profile of the active layer ACT. However, the disclosure is not limited thereto. For example, the first insulation layer IL1 may include an inorganic material.

The gate electrode GE may be disposed on the first insulation layer IL1 In an embodiment, the gate electrode GE may overlap the channel region of the active layer ACT.

The second insulation layer IL2 may be disposed on the first insulation layer IL1. The second insulation layer IL2 may cover the gate electrode GE and may be disposed to have substantially a same thickness along a profile of the gate electrode GE. However, the disclosure is not limited thereto.

The source electrode SE and the drain electrode DRE may be disposed on the second insulation layer IL2. The source electrode SE may contact the source region of the active layer ACT through a first contact hole formed in the first and second insulation layers IL1 and IL2. The drain electrode DRE may contact the drain region of the active layer ACT through a second contact hole formed in the first and second insulation layers IL1 and IL2.

The organic layer OL may be disposed on the second insulation layer IL2. The organic layer OL may cover the source and drain electrodes SE and DRE, and may have a substantially flat top surface without creating a step around the source and drain electrodes SE and DRE. For example, the organic layer OL may include an organic material.

In an embodiment, the organic layer OL may define grooves G. Each of the grooves G may have an undercut shape due to the pixel electrode layer PEL.

In an embodiment, the pixel electrode layer PEL may be disposed on the organic layer OL. The pixel electrode layer PEL may have reflective or transmissive properties. For example, the pixel electrode layer PEL may include a metal.

The pixel electrode layer PEL may include pixel electrodes and dummy electrodes. The pixel electrodes and the dummy electrodes may be spaced apart from each other, and the dummy electrodes may be disposed between adjacent pixel electrodes among the pixel electrodes in a plan view. Hereinafter, a first pixel electrode PE1 and a second pixel electrode PE2 among the pixel electrodes and a dummy electrode DE among the dummy electrodes will be described as a reference.

For example, the pixel electrode layer PEL may include a first pixel electrode PE1, a second pixel electrode PE2, and a dummy electrode DE spaced apart from each other. Accordingly, the first pixel electrode PE1, the second pixel electrode PE2, and the dummy electrode DE may be disposed on a same layer. The dummy electrode DE may be disposed between the first pixel electrode PE1 and the second pixel electrode PE2. However, embodiments according to the disclosure are not limited thereto.

The first pixel electrode PE1 may contact the source electrode SE or the drain electrode DRE included in the transistor TR through a third contact hole formed in the organic layer OL. Thus, the first pixel electrode PE1 may be connected to the transistor TR. Similarly, the second pixel electrode PE2 may also be connected to a transistor. The dummy electrode DE may be spaced apart from the transistor TR and may not be connected to the transistor TR.

The grooves G may surround each of the first pixel electrode PE1, the second pixel electrode PE2, and the dummy electrode DE in a plan view. The grooves G may be defined between adjacent electrodes included in the pixel electrode layer PEL. A width of each of the first pixel electrode PE1, the second pixel electrode PE2, and the dummy electrode DE may be greater than a width of a portion of the organic layer OL overlapping each of the first pixel electrode PE1, the second pixel electrode PE2, and the dummy electrode DE. Accordingly, each of the grooves G may have an undercut shape due to the first pixel electrode PE1, the second pixel electrode PE2, and the dummy electrode DE.

The pixel defining layer PDL may be disposed on the organic layer OL. An opening exposing a top surface of each of the first pixel electrode PE1 and the second pixel electrode PE2 may be defined in the pixel defining layer PDL. For example, a pixel opening POP overlapping each of the first pixel electrode PE1 and the second pixel electrode PE2 may be defined in the pixel defining layer PDL.

An opening exposing the dummy electrode DE may be defined in the pixel defining layer PDL. For example, a dummy opening DOP overlapping the dummy electrode DE may be defined in the pixel defining layer PDL. The dummy opening DOP may be spaced apart from the dummy electrode DE and a portion of the organic layer OL overlapping the dummy electrode DE. Accordingly, the dummy electrode DE may be spaced apart from the pixel defining layer PDL.

The spacer may be disposed on the pixel defining layer PDL. For example, the spacer may include an organic material or an inorganic material. The spacer may maintain a gap between the encapsulation layer and the substrate SUB.

The light emitting layer LEL may be disposed on the pixel defining layer PDL and the pixel electrode layer PEL. The light emitting layer LEL may be disposed in the pixel opening POP formed in the pixel defining layer PDL.

In an embodiment, the light emitting layer LEL may include a first portion LEL1 and a second portion LEL2. The second portion LEL2 may be a portion of the light emitting layer LEL which overlaps the dummy electrode DE. The light emitting layer LEL except for the second portion LEL2 may be the first portion LEL1. Accordingly, the first portion LEL1 may be a portion of the light emitting layer LEL which overlaps the first pixel electrode PE1 and the second pixel electrode PE2.

The first portion LEL1 and the second portion LEL2 may be spaced apart from each other. For example, the light emitting layer LEL may not be entirely connected on the pixel defining layer PDL and the pixel electrode layer PEL. The second portion LEL2 of the light emitting layer LEL may be spaced apart from the first portion LEL1 due to the dummy electrode DE and the dummy opening DOP.

The common electrode layer CEL may be disposed on the light emitting layer LEL. In an embodiment, the common electrode layer CEL may have a plate shape. The common electrode layer CEL may have transmissive or reflective properties. For example, the common electrode layer CEL may include a metal. Similarly, a portion of the common electrode layer CEL overlapping the second portion LEL2 may be spaced apart from another portion due to the dummy electrode DE and the dummy opening DOP.

The first pixel electrode PE1, the light emitting layer LEL, and the common electrode layer CEL may constitute a first light emitting diode LD1, and the second pixel electrode PE2 and the light emitting layer LEL, and the common electrode layer CEL may constitute a second light emitting diode LD2.

The encapsulation layer may prevent moisture and oxygen from penetrating into the first light emitting diode LD1 and the second light emitting diode LD2 from the outside. For example, the encapsulation layer may include a first inorganic encapsulation layer, an organic encapsulation layer, and a second inorganic encapsulation layer.

The first inorganic encapsulation layer may be disposed on the common electrode layer CEL to have substantially a same thickness along a profile of the common electrode layer CEL. The organic encapsulation layer may be disposed on the first inorganic encapsulation layer, and may have a substantially flat top surface without creating a step around the first inorganic encapsulation layer. The second inorganic encapsulation layer may be disposed on the organic encapsulation layer.

Figure 3:
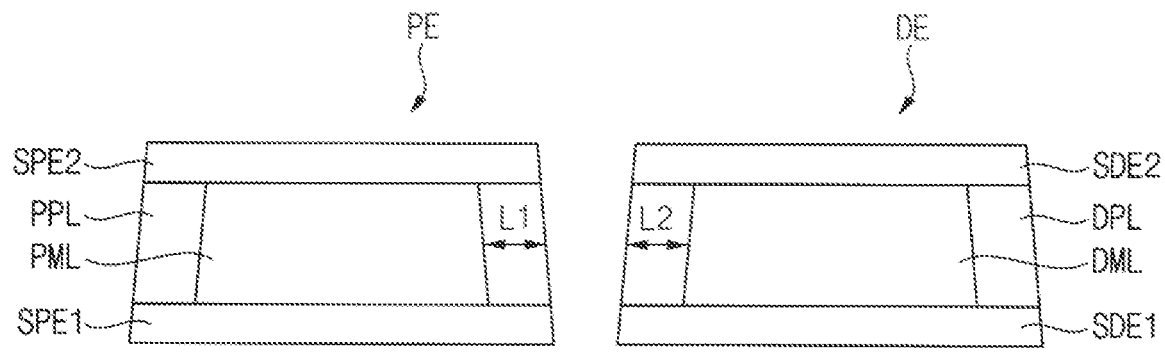
FIG. 3 is a schematic enlarged cross-sectional view of the first pixel electrode and the dummy electrode of FIG. 2.

FIG. 3 is a schematic enlarged cross-sectional view of the first pixel electrode and the dummy electrode of FIG. 2.

Referring to FIGS. 1 to 3, the pixel electrode PE (or e.g., the first pixel electrode PE1) may include a pixel metal layer PML, a pixel protective layer PPL, a first sub-pixel electrode SPE1, and a second sub-pixel electrode SPE2. The dummy electrode DE may include a dummy metal layer DML, a dummy protective layer DPL, a first sub-dummy electrode SDE1, and a second sub-dummy electrode SDE2. Similarly, the second pixel electrode PE2 may include a pixel metal layer PML, a pixel protection layer PPL, a first sub-pixel electrode SPE1, and a second sub-pixel electrode SPE2.

The first sub-pixel electrode SPE1 may be disposed on the organic layer OL. The pixel metal layer PML may be disposed on the first sub-pixel electrode SPE1. The second sub-pixel electrode SPE2 may be disposed on the pixel metal layer PML. The pixel protective layer PPL may be disposed between the first sub-pixel electrode SPE1 and the second sub-pixel electrode SPE2 and surround the pixel metal layer PML.

The first sub-dummy electrode SDE1 may be disposed on the organic layer OL. The dummy metal layer DML may be disposed on the first sub-dummy electrode SDE1. The second sub-dummy electrode SDE2 may be disposed on the dummy metal layer DML. The dummy protective layer DPL may be disposed between the first sub-dummy electrode SDE1 and the second sub-dummy electrode SDE2 and surround the dummy metal layer DML.

The first sub-pixel electrode SPE1 and the first sub-dummy electrode SDE1 may be disposed on a same layer and may include a same material. For example, the first sub-pixel electrode SPE1 and the first sub-dummy electrode SDE1 may include indium tin oxide (ITO), indium zinc oxide (IZO), or the like.

The second sub-pixel electrode SPE2 and the second sub-dummy electrode SDE2 may be disposed on a same layer and may include a same material. For example, the second sub-pixel electrode SPE2 and the second sub-dummy electrode SDE2 may include indium tin oxide (ITO), indium zinc oxide (IZO), or the like. Each of the first and second sub-pixel electrodes SPE1 and SPE2 and the first and second sub-dummy electrodes SDE1 and SDE2 may have a thickness of about 10 Å to about 1000 Å.

The pixel metal layer PML, and the dummy metal layer DML, may be disposed on a same layer and may include a same material. The pixel metal layer PML and the dummy metal layer DML may include metal. For example, the pixel metal layer PML and the dummy metal layer DML may include silver (Ag), aluminum (Al), iron (Fe), nickel (Ni), copper (Cu), platinum (Pt), gold (Au) and the like. Each of the pixel metal layer PML and the dummy metal layer DML may have a thickness of about 100 Å to about 3000 Å.

The pixel protective layer PPL and the dummy protective layer DPL may include a same material. The pixel protective layer PPL and the dummy protective layer DPL may include at least one of an oxide and a halide.

The pixel protective layer PPL may be formed by converting a side surface of the pixel metal layer PML into an oxide and a halide. In case that the pixel metal layer PML is naturally oxidized, a native oxide may be generated from the pixel metal layer PML to form the pixel protective layer PPL. In case that plasma treatment is applied to the pixel metal layer PML, an oxide or a halide may be generated from the pixel metal layer PML.

Similarly, the dummy protective layer DPL may be formed by converting a side surface of the dummy metal layer DML into an oxide and a halide. In case that the dummy metal layer DML is naturally oxidized, a native oxide may be generated from the dummy metal layer DML to form the dummy protective layer DPL. In case that plasma treatment is applied to the dummy metal layer DML, an oxide or a halide may be generated from the dummy metal layer DML.

A length L1 from the side surface of the pixel metal layer PML to a side surface of the pixel protective layer PPL may be between about 5 Å and about 1000 Å. For example, a width of the pixel protective layer PPL may be between about 5 Å and about 1000 Å.

Similarly, a length L2 from the side surface of the dummy metal layer DML to a side surface of the dummy protective layer DPL may also be between about 5 Å and about 1000 Å. For example, a width of the dummy protective layer DPL may be between about 5 Å and about 1000 Å.

In case that the width of each of the pixel protective layer PPL and the dummy protective layer DPL is less than about 5 Å, it may be difficult for the pixel protective layer PPL and the dummy protective layer DPL to protect the pixel metal layer PML, and the dummy metal layer DML, respectively, during a manufacturing process.

In case that the width of the pixel protective layer PPL is greater than about 1000 Å, the light emitting area defined by the pixel opening POP may partially overlap the pixel protective layer PPL. Accordingly, the light emitting area of the display device 10 may be reduced, and thus light emitting efficiency may be reduced.

In an embodiment, as the electrodes PE1, PE2, and DE included in the display device 10 include the pixel protective layer PPL or the dummy protective layer DPL, the pixel protective layer PPL may protect the pixel metal layer PML, and the dummy protective layer DPL may protect the dummy metal layer DML. Accordingly, during the manufacturing process of the display device 10, the pixel metal layer PML and the dummy metal layer DML are protected, so that the formation of byproducts due to the pixel metal layer PML and the dummy metal layer DML may be prevented.

As a result, stability of the display device 10 may be improved, and leakage current between the first and second pixel electrodes PE1 and PE2 is prevented, so that the problem of color mixing between the pixels PX may be solved.

Figure 4:
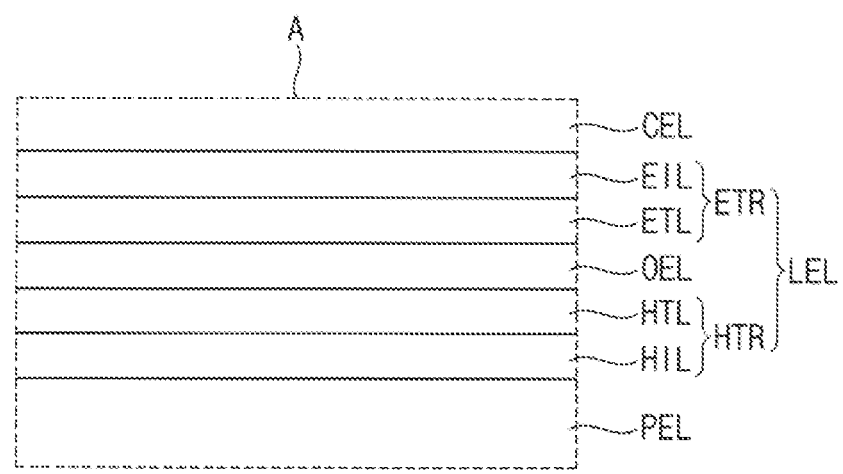
FIG. 4 is a schematic enlarged cross-sectional view of area A of FIG. 2.

FIG. 4 is a schematic enlarged cross-sectional view of area A of FIG. 2.

Referring to FIGS. 2 and 4, in an embodiment, the light emitting layer LEL may include a hole transport region HTR, an organic emission layer OEL, and an electron transport region ETR. The hole transport region HTR may be disposed on the pixel electrode layer PEL. For example, the hole transport region HTR may be disposed on the first pixel electrode PE1, the second pixel electrode PE2, the dummy electrode DE, and the pixel defining layer PDL.

The hole transport region HTR may have a single layer made of a single material, a single layer made of different materials, or a multilayer structure having layers made of different materials.

For example, the hole transport region HTR may have a structure of a single layer or a multilayer structure of a hole injection layer HIL and/or a hole transport layer HTL. However, embodiments according to the disclosure are not limited thereto, and the hole transport region HTR may further include at least one of a hole buffer layer, a light emitting auxiliary layer, and an electron blocking layer.

The organic emission layer OEL may be disposed on the hole transport region HTR. Similar to the hole transport region HTR, the organic emission layer OEL may be disposed on the first pixel electrode PE1, the second pixel electrode PE2, the dummy electrode DE, and the pixel defining layer PDL. The organic emission layer OEL may include a light emitting material.

The electron transport region ETR may be disposed on the organic emission layer OEL. The electron transport region ETR, similar to the hole transport region HTR and the organic emission layer OEL, may be disposed on the first pixel electrode PE1, the second pixel electrode PE2, the dummy electrode DE, and the pixel defining layer PDL.

The electron transport region ETR may have a single layer made of a single material, a single layer made of different materials, or a multilayer structure having layers made of different materials.

For example, the electron transport region ETR may have a single-layer or multi-layer structure of an electron injection layer EIL and/or an electron transport layer ETL. However, embodiments according to the disclosure are not limited thereto, and the electron transport region ETR may further include a hole blocking layer.

The common electrode layer CEL may be formed on the electron transport region ETR.

In an embodiment, as the light emitting layer LEL is cut off by the dummy electrode DE, the hole transport region HTR may also be cut off. Accordingly, leakage current between the first and second pixel electrodes PE1 and PE2 due to the extension of the hole transport region HTR included in the light emitting layer LEL is prevented, so that the problem of color mixing between the pixels (e.g., the pixel PX of FIG. 1) may be solved.

Figure 5:
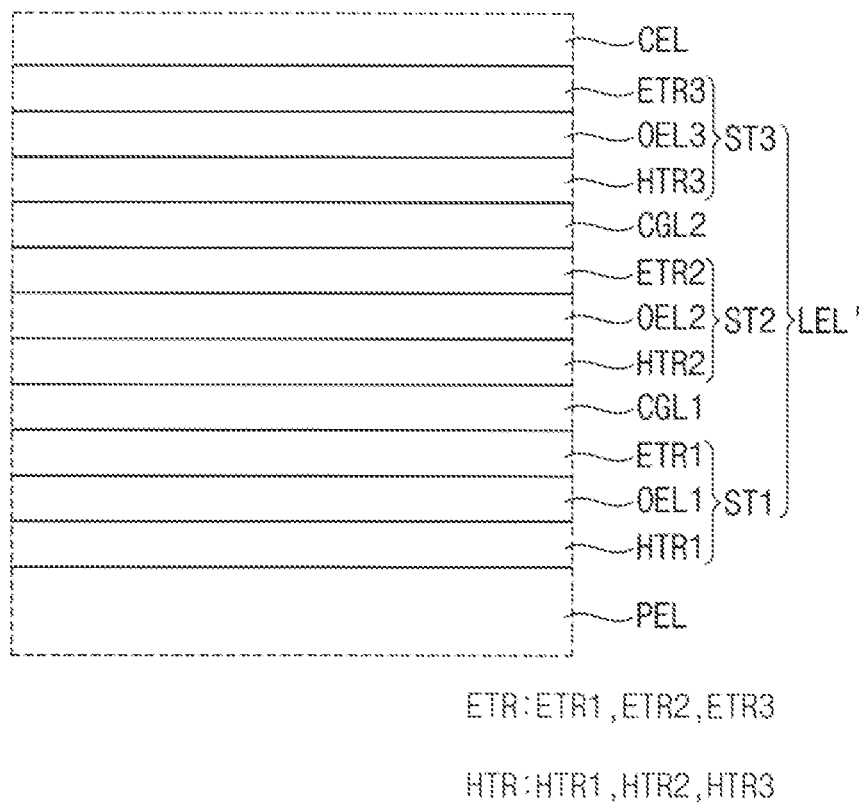
FIG. 5 is a schematic cross-sectional view illustrating another example of FIG. 4.

FIG. 5 is a schematic cross-sectional view illustrating another example of FIG. 4.

A description of a portion overlapping with the light emitting layer LEL described with reference to FIG. 4 among a light emitting layer LEL' described with reference to FIG. 5 may be omitted.

Referring to FIGS. 2 and 5, in an embodiment, the light emitting layer LEL' may have a structure in which light emitting structures are overlapped, for example, a tandem structure. Unlike FIG. 5, FIG. 4 illustrates that the light emitting layer LEL may have a structure including only a light emitting structure.

For example, the light emitting layer LEL' may include a first stack ST1 including a first organic emission layer OEL1, and a second stack ST2 disposed on the first stack ST1 and including a second organic emission layer OEL2, a third stack ST3 disposed on the second stack ST2 and including a third organic emission layer OEL3, a first charge generation layer CGL1 disposed between the first stack ST1 and the second stack ST2, and a second charge generation layer CGL2 disposed between the second stack ST2 and the third stack ST3. The first, second, and third stack ST1, ST2, and ST3 may include a first second, and third electron transport regions ETR1, ETR2, and ETR3, and a first, second, and third hole transport regions HTR1, HTR2, and HTR3, respectively. However, embodiments according to the disclosure are not limited thereto.

The first stack ST1, the second stack ST2, and the third stack ST3 may be disposed to overlap each other. The first organic emission layer OEL1, the second organic emission layer OEL2, and the third organic emission layer OEL3 may be disposed to overlap each other. Each of the stacks ST1, ST2, and ST3 may include a hole transport region HTR and an electron transport region ETR.

Light emitted from each of the stacks ST1, ST2, and ST3 may be light having a same color. However, embodiments according to the disclosure are not limited thereto, and light emitted from each of the stacks ST1, ST2, and ST3 may be light having different colors. Accordingly, the light emitting layer LEL' may emit white light.

Each of the first charge generation layer CGL1 and the second charge generation layer CGL2 may serve to inject charges into each of the first to third organic emission layers OEL1, OEL2, and OEL3. The first charge generation layer CGL1 may serve to adjust a charge balance between the first stack ST1 and the second stack ST2. The second charge generation layer CGL2 may serve to adjust a charge balance between the second stack ST2 and the third stack ST3.

Each of the first charge generation layer CGL1 and the second charge generation layer CGL2 may include an n-type charge generation layer and a p-type charge generation layer. The n-type charge generation layer may supply electrons to each of the first to third organic emission layers OEL1, OEL2, and OEL3, and the p-type charge generation layer may supply holes to each of the first to third organic emission layers OEL1, OEL2, and OEL3. However, embodiments according to the disclosure are not limited thereto.

In an embodiment, as the light emitting layer LEL' is cut off by the dummy electrode DE, the hole transport region HTR included in each of the stacks ST1, ST2, and ST3, and the first and second charge generating layers CGL1 and CGL2 disposed between the stacks ST1, ST2, and ST3 may also be cut off. Accordingly, leakage current between the first and second pixel electrodes PE1 and PE2 due to the extension of the hole transport regions HTR and the first and second charge generation layers CGL1 and CGL2 included in the light emitting layer LEL is prevented. The problem of color mixing between the pixels (e.g., the pixel PX of FIG. 1) may be solved.

FIGS. 6 to 15 are schematic views for explaining a method of manufacturing a display device according to an embodiment.

A method of manufacturing a display device described with reference to FIGS. 6 to 15 may be a method of manufacturing the display device 10 described with reference to FIGS. 1 to 3. Therefore, the overlapping description may be omitted.

Figure 6:
FIGS. 6 to 15 are views for illustrating a method of manufacturing a display device according to an embodiment.
Figure 7:
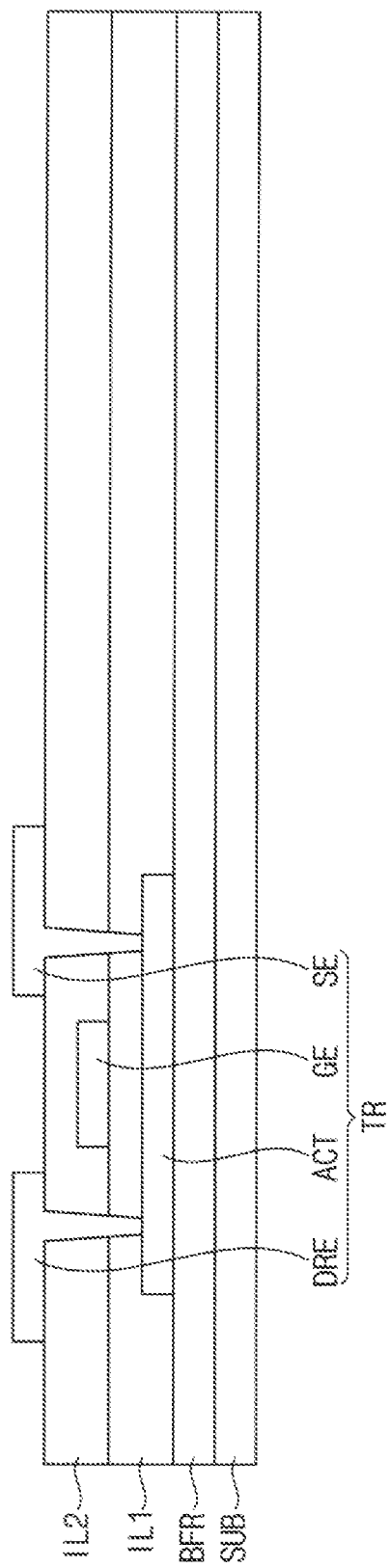

Referring to FIGS. 6 and 7, a transistor TR may be formed on a substrate SUB. A buffer layer BFR may be formed on the substrate SUB. An active layer ACT may be formed on the buffer layer BFR. A first insulation layer IL1 may be formed on the buffer layer BFR to cover the active layer ACT. A gate electrode GE may be formed on the first insulation layer IL1. A second insulation layer IL2 may be formed on the first insulation layer IL1 to cover the gate electrode GE. A drain electrode DRE and a source electrode SE may be formed on the second insulation layer IL2. A first contact hole and a second contact hole may be formed in the first and second insulation layers IL1 and IL2. The source electrode SE may contact the source region of the active layer ACT through the first contact hole, and the drain electrode DRE may contact the drain region of the active layer ACT through the second contact hole.

The active layer ACT, the gate electrode GE, the drain electrode DRE, and the source electrode SE may form the transistor TR.

Figure 8:
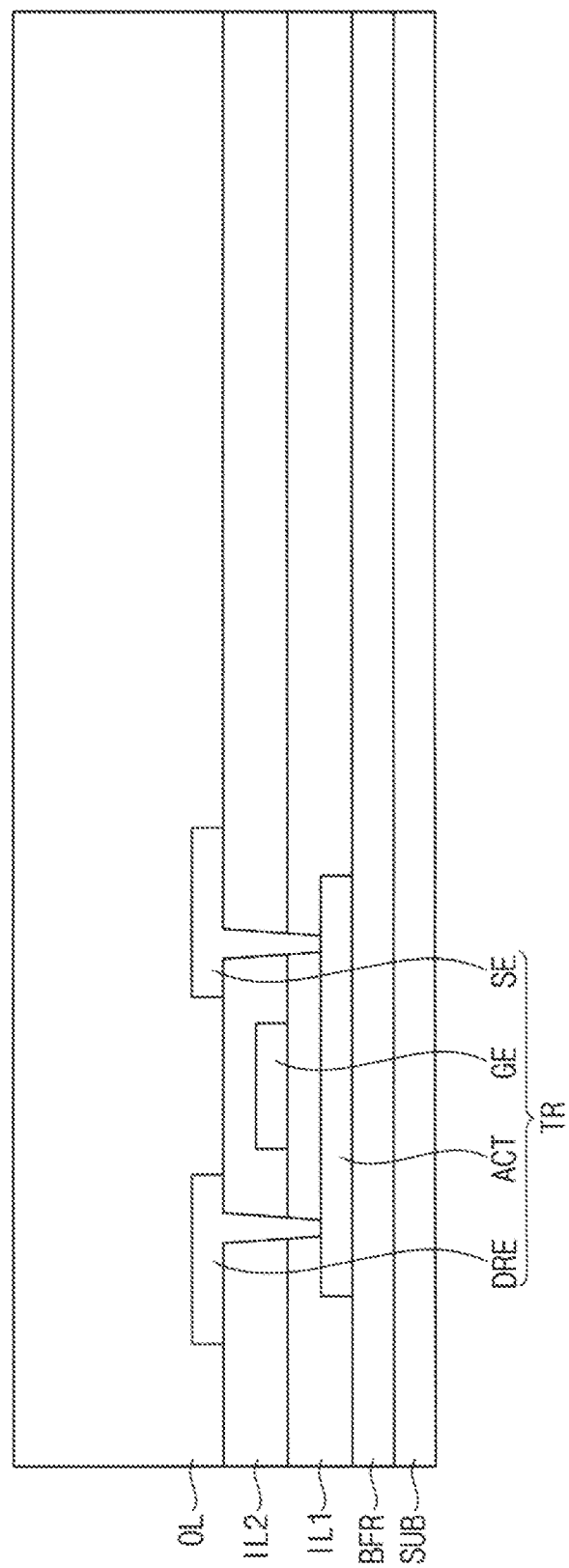

Referring further to FIG. 8, an organic layer OL may be formed on the transistor TR. The organic layer OL may cover the source electrode SE and the drain electrode DRE and may be disposed on the second insulation layer IL2. The organic layer OL may be formed of (or include) an organic material, and may planarize a top surface of the organic layer OL.

Figure 9:
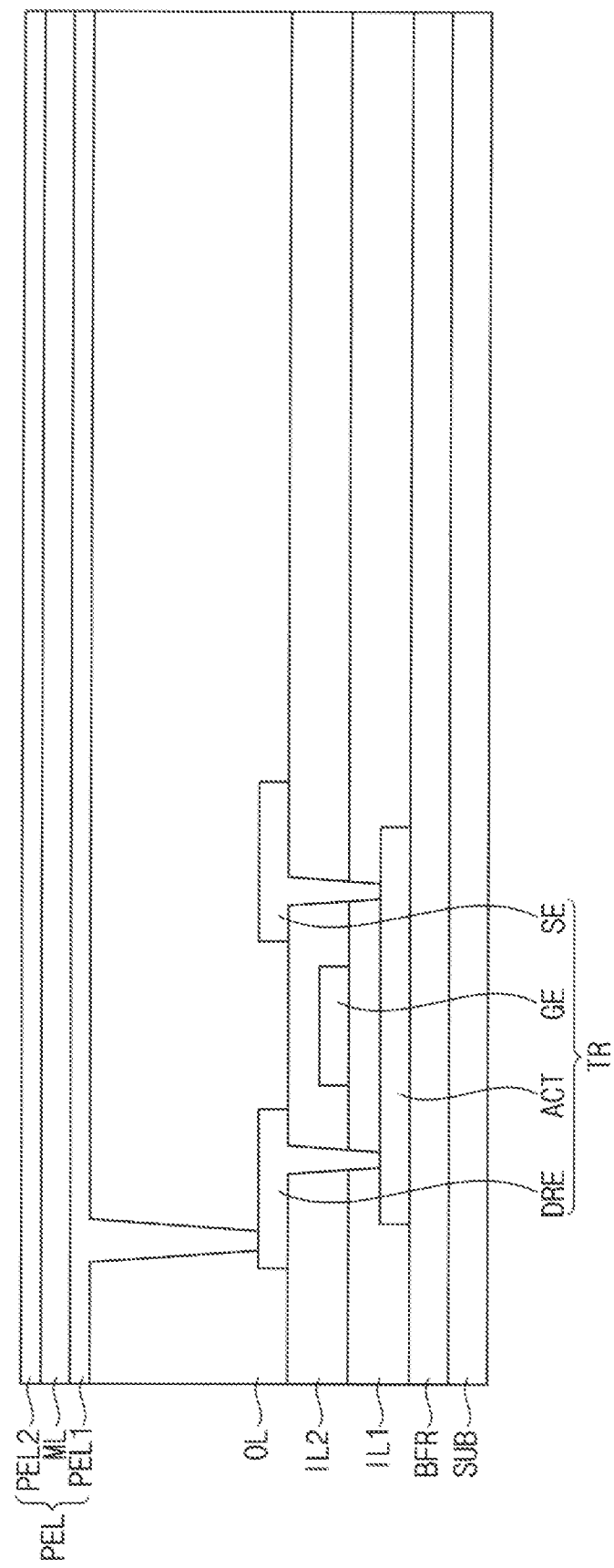

Referring further to FIG. 9, a pixel electrode layer PEL may be formed on the organic layer OL. A first sub-pixel electrode layer PEL1 may be formed on the organic layer OL. A metal layer ML may be formed on the first sub-pixel electrode layer PEL1. A second sub-pixel electrode layer PEL2 may be formed on the metal layer ML.

The first sub-pixel electrode layer PEL1, the metal layer ML, and the second sub-pixel electrode layer PEL2 may form the pixel electrode layer PEL.

For example, the first sub-pixel electrode layer PEL1 and the second sub-pixel electrode layer PEL2 may be formed of (or include) indium tin oxide (ITO), indium zinc oxide (IZO), or the like. The metal layer ML may be formed of silver (Ag), aluminum (Al), iron (Fe), nickel (Ni), copper (Cu), platinum (Pt), gold (Au), or the like.

Figure 10:
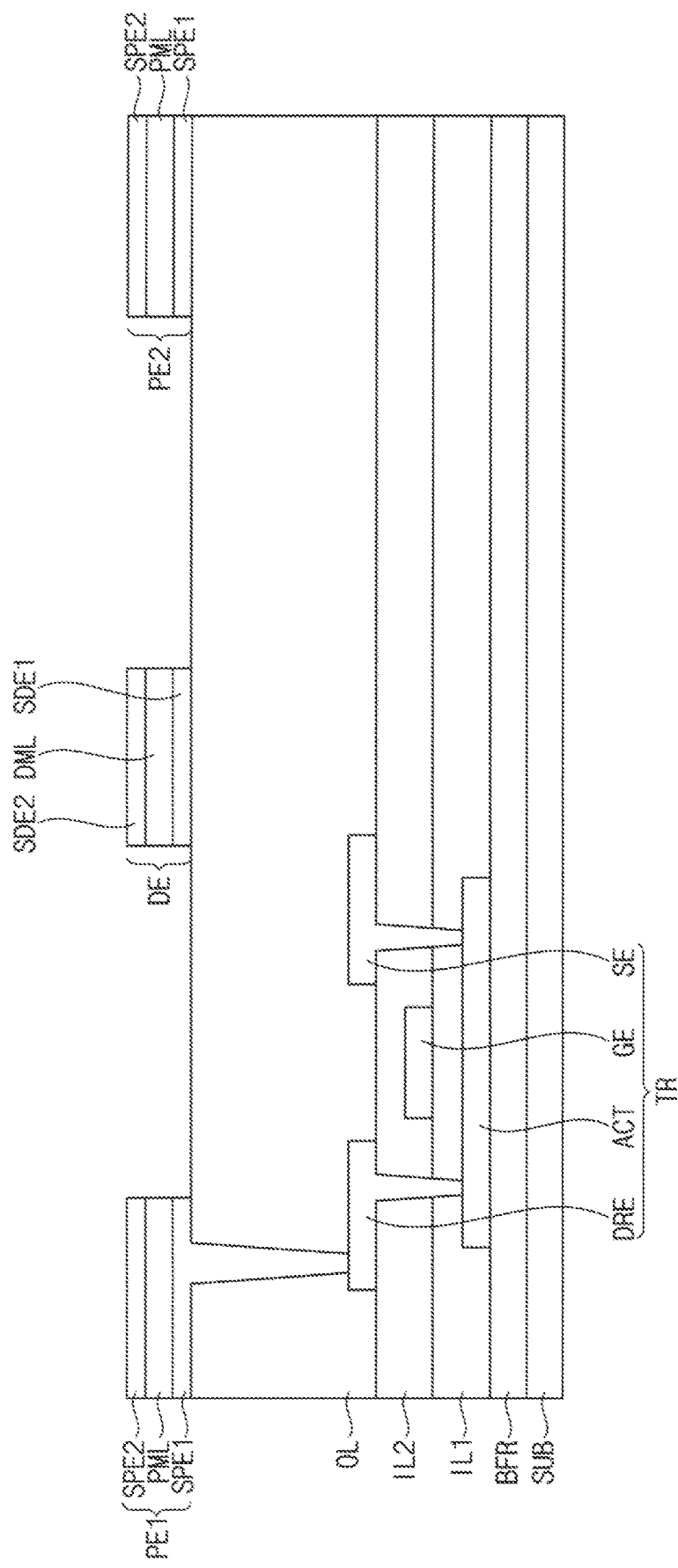

Referring further to FIG. 10, pixel electrodes and dummy electrodes may be formed by patterning the pixel electrode layer PEL. In an embodiment, the pixel electrodes and the dummy electrodes may be spaced apart from each other. The dummy electrodes may be formed between adjacent pixel electrodes among the pixel electrodes.

Specifically, first sub-pixel electrodes and first sub-dummy electrodes may be formed by patterning the first sub-pixel electrode layer PEL1. Second sub-pixel electrodes and second sub-dummy electrodes may be formed by patterning the second sub-pixel electrode layer PEL2. Pixel metal layers and dummy metal layers may be formed by patterning the metal layer ML.

For example, a first pixel electrode PE1, a second pixel electrode PE2, and a dummy electrode DE may be formed by patterning the pixel electrode layer PEL. The first pixel electrode PE1 may include a first sub-pixel electrode SPE1, a pixel metal layer PML, and a second sub-pixel electrode SPE2, the second pixel electrode PE2 may include a first sub-pixel electrode SPE1, a pixel metal layer PML, and a second sub-pixel electrode SPE2, and the dummy electrode DE may include a first sub-dummy electrode SDE1, a dummy metal layer DML, and a second sub-dummy electrode SDE2.

Hereinafter, the first pixel electrode PE1 and the second pixel electrode PE2 among the pixel electrodes and the dummy electrode DE among the dummy electrodes will be described as a reference.

Figure 11:
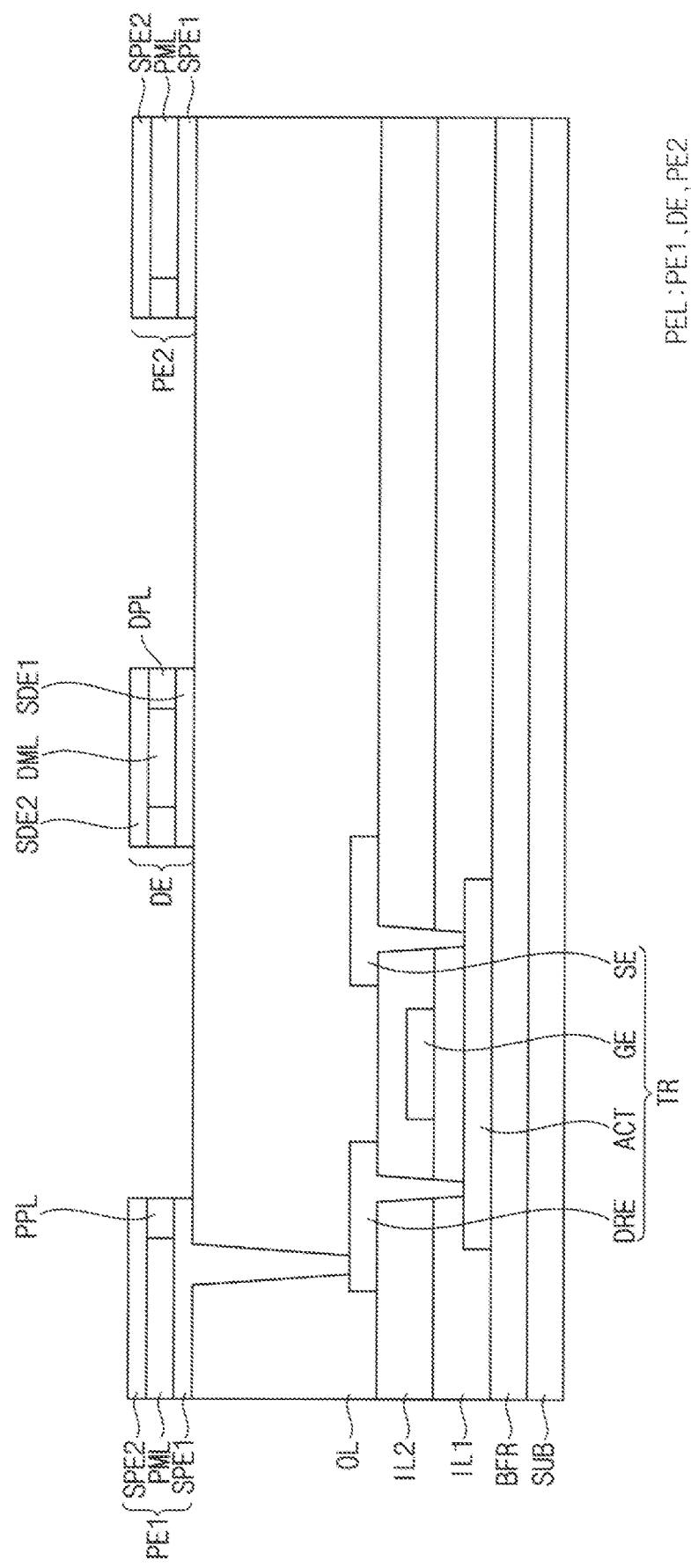

Referring further to FIG. 11, in an embodiment, a portion of the pixel metal layer PML and the dummy metal layer DML may be oxidized.

In an embodiment, in case that the pixel electrode layer PEL is patterned, side surfaces of the pixel metal layer PML and the dummy metal layer DML may be exposed. In case that a side surface of each of the pixel metal layer PML and the dummy metal layer DML is exposed, the side surface may be naturally oxidized.

In case that the side surface of the pixel metal layer PML is naturally oxidized, the side surface of the pixel metal layer PML may be converted into an oxide due to the natural oxidation. Accordingly, a pixel protective layer PPL including the oxide may be formed.

In case that the side surface of the dummy metal layer DML is naturally oxidized, the side surface of the dummy metal layer DML may be converted into an oxide due to the natural oxidation. Accordingly, a dummy protective layer DPL including the oxide may be formed.

Accordingly, the pixel protective layer PPL and the dummy protective layer DPL may be simultaneously formed.

However, embodiments according to the disclosure are not limited thereto. In another embodiment, a plasma treatment may be performed on the first pixel electrode PE1, the second pixel electrode PE2, and the dummy electrode DE. A portion of the pixel metal layer PML and the dummy metal layer DML may be oxidized or halogenated due to (or by) the plasma treatment.

In case that the pixel electrode layer PEL is patterned, side surfaces of the pixel metal layer PML and the dummy metal layer DML may be exposed. In case that the side surfaces of the pixel metal layer PML and the dummy metal layer DML are exposed, the side surfaces of the pixel metal layer PML and the dummy metal layer DML may be oxidized or halogenated using the plasma treatment.

In case that the side surface of the pixel metal layer PML is treated by the plasma, the side surface of the pixel metal layer PML, may be converted into an oxide or a halide due to oxidation or halogenation. Accordingly, the pixel protective layer PPL including the oxide or the halide may be formed.

In case that the side surface of the dummy metal layer DML is treated by the plasma, the side surface of the dummy metal layer DML may be converted into an oxide or a halide due to oxidation or halogenation. Accordingly, the dummy protective layer DPL including the oxide or the halide may be formed.

Accordingly, the forming of the pixel protective layer PPL and the forming of the dummy protective layer DPL may be simultaneously performed.

Figure 12:
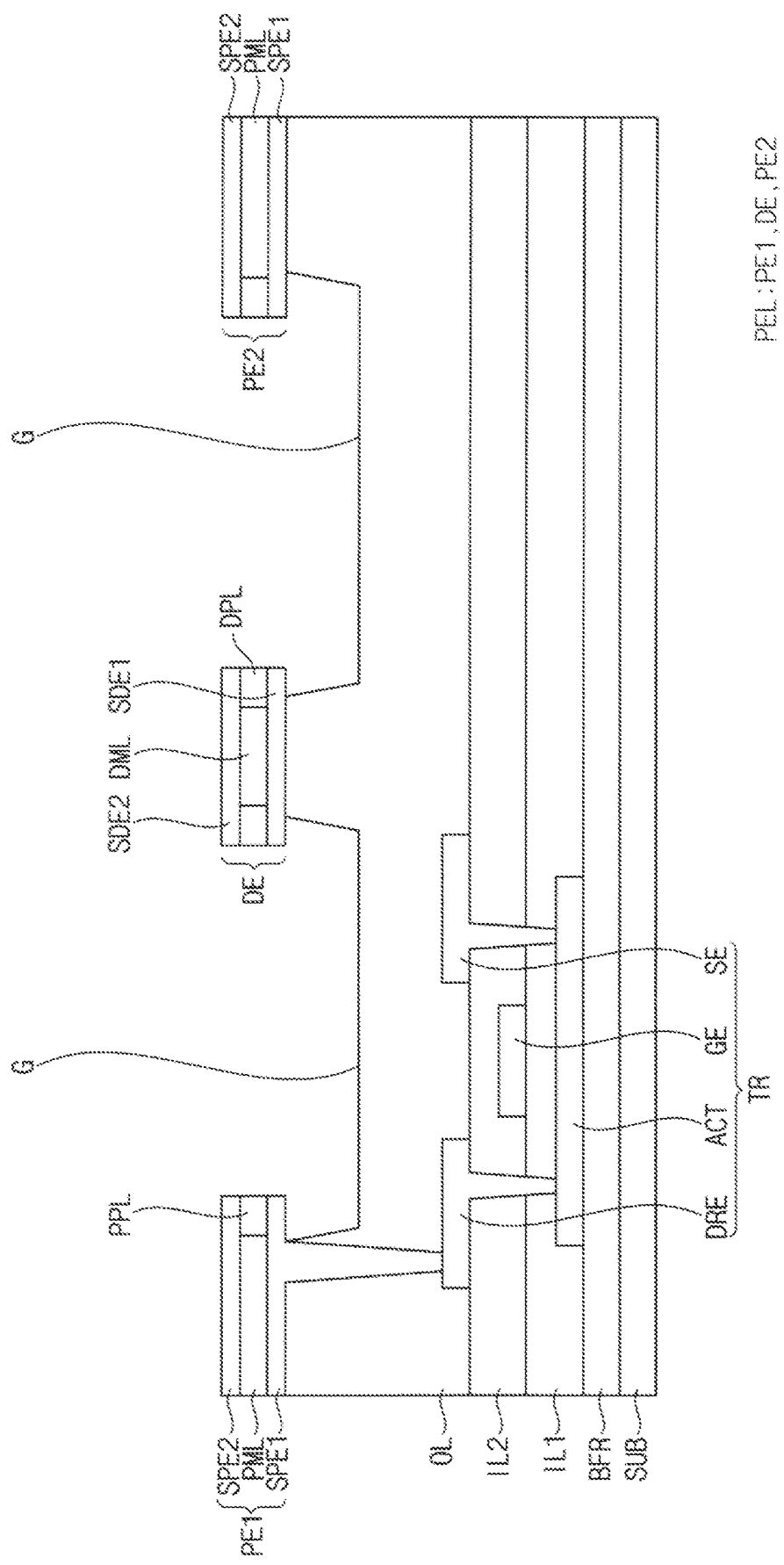

Referring further to FIG. 12, a groove G may be formed in the organic layer OL. The groove G may be formed between the first pixel electrode PE1, the second pixel electrode PE2, and the dummy electrode DE in a plan view. A portion of the organic layer OL excluding a portion overlapping the first pixel electrode PE1, the second pixel electrode PE2, and the dummy electrode DE may be partially removed. The groove G may be formed in an undercut shape due to the first pixel electrode PE1, the second pixel electrode PE2, and the dummy electrode DE.

Figure 13:
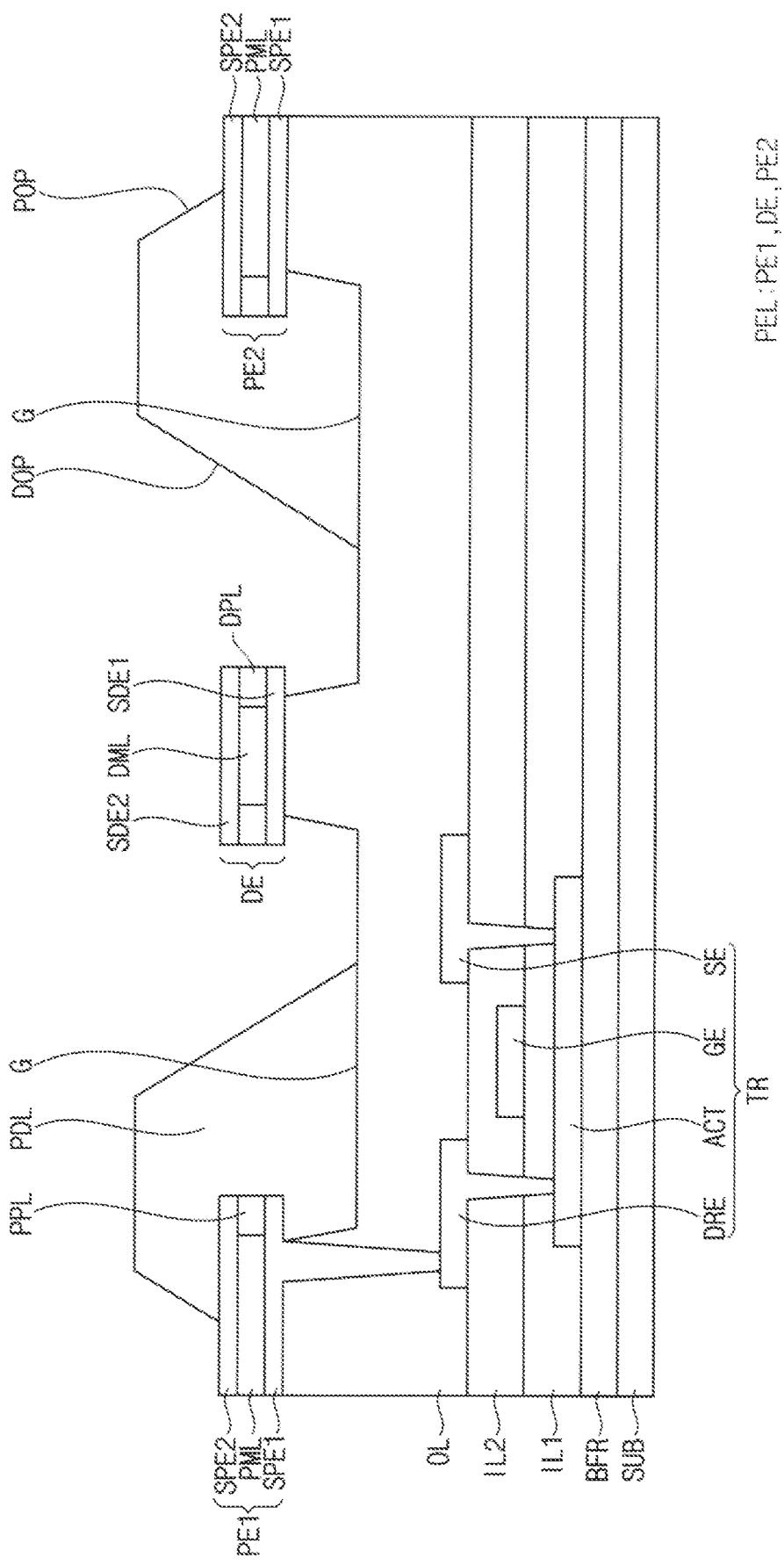

Referring further to FIG. 13, the pixel defining layer PDL may be formed on the organic layer OL. The pixel defining layer PDL may define a pixel opening POP overlapping each of the first pixel electrode PE1 and the second pixel electrode PE2 and a dummy opening DOP overlapping the dummy electrode DE.

The pixel opening POP and the dummy opening DOP may be formed using a mask. The pixel opening POP may be formed to overlap each of the first pixel electrode PE1 and the second pixel electrode PE2. The pixel opening POP may have a smaller area than each of the first pixel electrode PE1 and the second pixel electrode PE2. Accordingly, the first pixel electrode PE1 and the second pixel electrode PE2 may contact the pixel defining layer PDL.

The dummy opening DOP may be formed to overlap the dummy electrode DE. The dummy opening DOP may be spaced apart from the dummy electrode DE and a portion of the organic layer OL overlapping the dummy electrode DE. Accordingly, the dummy electrode DE may be spaced apart from the pixel defining layer PDL.

Figure 14:
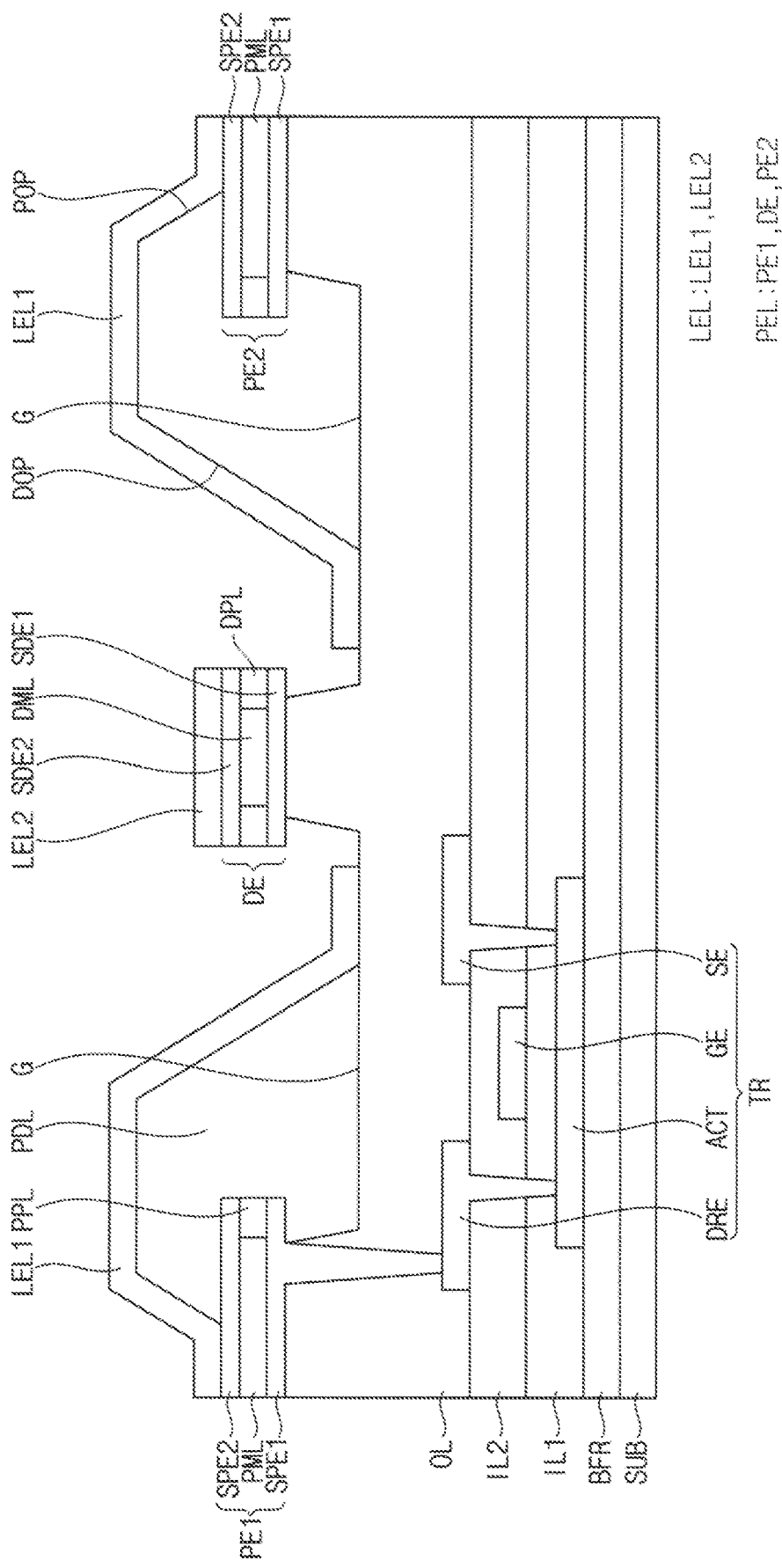

Referring further to FIG. 14, in an embodiment, a light emitting layer LEL may be formed on the pixel defining layer PDL, the first pixel electrode PE1, the second pixel electrode PE2, and the dummy electrode DE.

In an embodiment, the light emitting layer LEL may include a hole transport region (e.g., the hole transport region HTR of FIG. 4), an organic emission layer (e.g., the organic emission layer OEL of FIG. 4), and an electron transport region (e.g., the electron transport region ETR of FIG. 4).

However, embodiments according to the disclosure are not limited thereto, and the light emitting layer LEL may be formed in a structure in which light emitting structures are overlapped, for example, a tandem structure. For example, the light emitting layer LEL may include a first stack (e.g., the first stack ST1 of FIG. 5) including a first organic emission layer (e.g., the first organic emission layer OEL1 of FIG. 5), a second stack (e.g., the second stack ST2 of FIG. 5) disposed on the first stack and including a second organic emission layer (e.g., the second organic emission layer OEL2 of FIG. 5), and a third stack (e.g., the third stack ST3 of FIG. 5) disposed on the second stack and including a third organic emission layer (e.g., the third organic emission layer OEL3 of FIG. 5), a first charge generation layer (e.g., the first charge generation layer CGL1 of FIG. 5) disposed between the first stack and the second stack, and a second charge generation layer (e.g., the second charge generation layer CGL2 of FIG. 5) disposed between the second stack and the third stack.

In an embodiment, the light emitting layer LEL may be formed by the first portion LEL1 and the second portion LEL2 to be spaced apart from each other. The second portion LEL2 may be a portion overlapping the dummy electrode DE. The light emitting layer LEL except for the second portion LEL2 may be the first portion LEL1. Accordingly, the first portion LEL1 may be a portion of the light emitting layer LEL overlapping the first pixel electrode PE1 and the second pixel electrode PE2.

In case that the light emitting layer LEL is formed, the light emitting layer LEL may be divided into the first portion LEL1 and the second portion LEL2 due to the dummy electrode DE. Accordingly, the light emitting layer LEL may be partially cut off.

Figure 15:
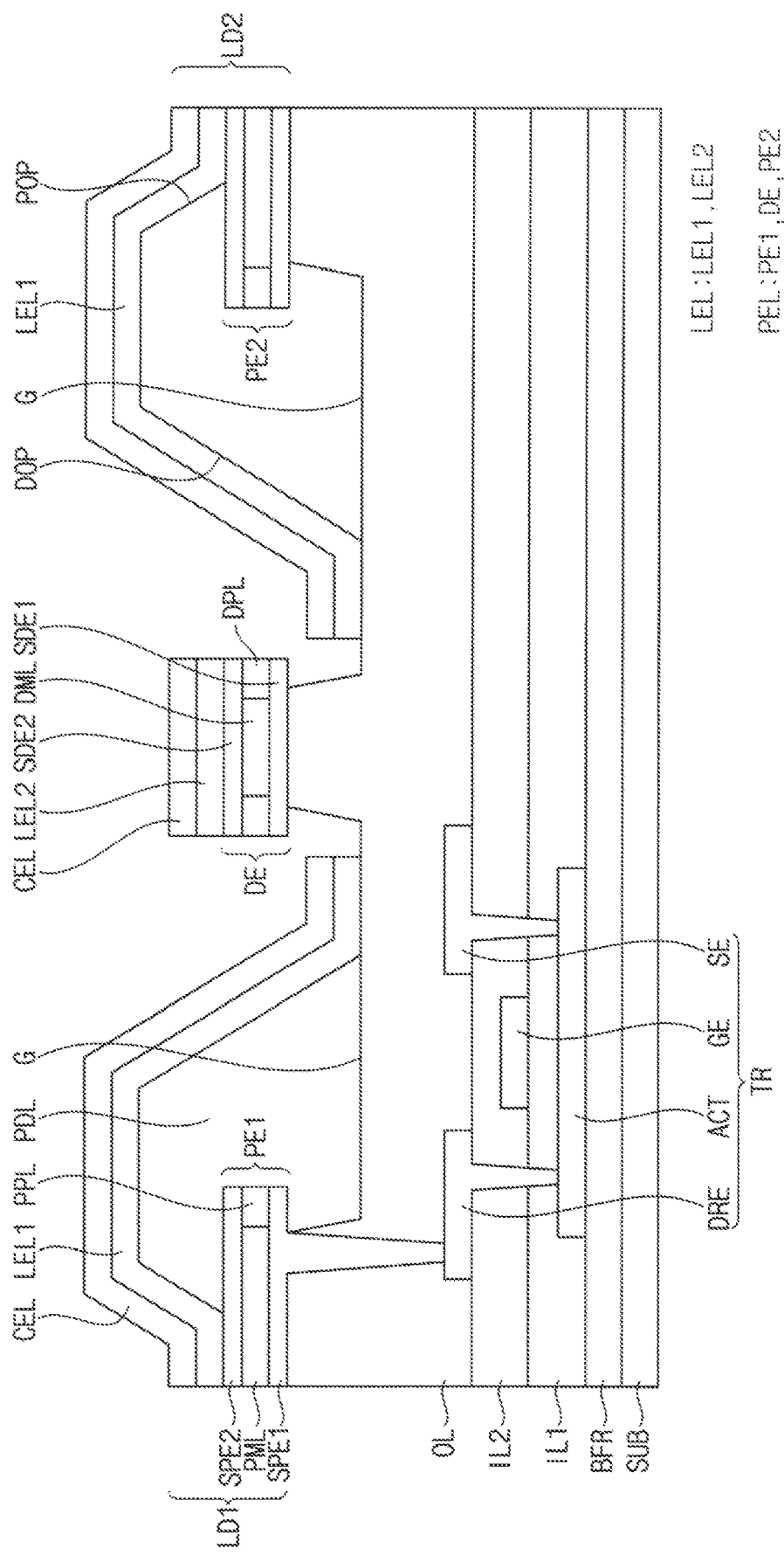

Referring further to FIG. 15, a common electrode layer CEL may be formed on the light emitting layer LEL. The common electrode layer CEL may also be partially cut off due to the dummy electrode DE.

The first pixel electrode PE1, the light emitting layer LEL, and the common electrode layer CEL may form a first light emitting diode LD1, and the second pixel electrode PE2, the light emitting layer LEL, and the common electrode layer CEL may form a second light emitting diode LD2.

In an embodiment, the pixel protective layer PPL and the dummy protective layer DPL respectively surrounding the pixel metal layer PML, and the dummy metal layer DML, may be formed by oxidizing or halogenating using the natural oxidation or the plasma treatment. The pixel protective layer PPL and the dummy protective layer DPL may protect the pixel metal layer PML and the dummy metal layer DML, respectively. Accordingly, as the pixel metal layer PML and the dummy metal layer DML are protected during the manufacturing process of the display device, the formation of byproducts due to the pixel metal layer PML and the dummy metal layer DML may be prevented.

As a result, the stability of the display device 10 may be improved, and leakage current between the first and second pixel electrodes PE1 and PE2 may be prevented, so that problem of the color mixing between the pixels may be solved.

The display devices and the methods according to the embodiments may be applied to a display device included in a computer, a laptop, a mobile phone, a smartphone, a smart pad, a portable multimedia player (PMP), a personal digital assistant (PDA), an MP3 player, or the like.

Although the display devices and the methods according to the embodiments have been described with reference to the drawings, the illustrated embodiments are examples, and may be modified and changed by a person having ordinary knowledge in the relevant technical field without departing from the technical spirit described in the following claims.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a transistor disposed on a substrate;
an organic layer disposed on the transistor and defining grooves;
a first pixel electrode disposed on the organic layer, electrically connected to the transistor, and including a pixel metal layer and a pixel protective layer, the pixel protective layer including at least one of an oxide and a halide and surrounding the pixel metal layer; and
a dummy electrode disposed on the organic layer, spaced apart from the transistor, and including a dummy metal layer and a dummy protective layer, the dummy protective layer including at least one of an oxide and a halide and surrounding the dummy metal layer.

2. The display device of claim 1, wherein the dummy electrode and the first pixel electrode are disposed on a same layer, are spaced apart from each other, and include a same material.

3. The display device of claim 1, wherein
the first pixel electrode further includes:
a first sub-pixel electrode disposed under the pixel metal layer; and
a second sub-pixel electrode disposed on the pixel metal layer, and
the dummy electrode further includes:
a first sub-dummy electrode disposed under the dummy metal layer; and
a second sub-dummy electrode disposed on the dummy metal layer.

4. The display device of claim 3, wherein
the first sub-pixel electrode and the first sub-dummy electrode are disposed on a same layer and include a same material,
the pixel metal layer and the dummy metal layer are disposed on a same layer and include a same material, and
the second sub-pixel electrode and the second sub-dummy electrode are disposed on a same layer and include a same material.

5. The display device of claim 1, wherein each of the grooves has an undercut shape.

6. The display device of claim 1, wherein the grooves surround each of the first pixel electrode and the dummy electrode in a plan view.

7. The display device of claim 1, further comprising:
a pixel defining layer disposed on the organic layer and defining a pixel opening overlapping the first pixel electrode in a plan view;
a light emitting layer disposed on the pixel defining layer, the first pixel electrode, and the dummy electrode and disposed in the pixel opening; and
a common electrode layer disposed on the light emitting layer.

8. The display device of claim 7, wherein the dummy electrode is spaced apart from the pixel defining layer.

9. The display device of claim 7, wherein
the light emitting layer includes:
a first portion overlapping the first pixel electrode in a plan view; and
a second portion overlapping the dummy electrode in a plan view, and
the first portion and the second portion are spaced apart from each other.

10. The display device of claim 1, wherein each of a length from a side surface of the pixel metal layer to a side surface of the pixel protective layer and a length from a side surface of the dummy metal layer to a side surface of the dummy protective layer is about 5 Å to about 1000 Å.

* * * * *